(12) United States Patent
Shearer et al.

(10) Patent No.: US 7,327,073 B2
(45) Date of Patent: Feb. 5, 2008

(54) ACOUSTIC RESONATORS

(75) Inventors: Christine Janet Shearer, Bristol (GB); Carl David Brancher, Avergavenny (GB); Rajkumar Jakkaraju, Newport (GB)

(73) Assignee: Aviza Technologies Limited, Newport, Gwent (GB)

( * ) Notice: Subject to any disclaimer, the term of this patent is extended or adjusted under 35 U.S.C. 154(b) by 275 days.

(21) Appl. No.: 11/196,239

(22) Filed: Aug. 4, 2005

(65) Prior Publication Data

US 2005/0269900 A1  Dec. 8, 2005

Related U.S. Application Data

(62) Division of application No. 10/637,654, filed on Aug. 11, 2003, now Pat. No. 6,944,922.

(60) Provisional application No. 60/402,728, filed on Aug. 13, 2002.

(30) Foreign Application Priority Data

Aug. 13, 2002 (GB) .................................. 0218762.3
Nov. 30, 2002 (GB) .................................. 0227981.8

(51) Int. Cl.
*H01L 41/047* (2006.01)

(52) U.S. Cl. ..................... 310/363; 310/364; 29/25.35

(58) Field of Classification Search ................ 310/322, 310/324, 334, 363–365; 29/25.35
See application file for complete search history.

(56) References Cited

U.S. PATENT DOCUMENTS

| 4,371,421 A | 2/1983 | Fan et al. |
| 4,668,331 A | 5/1987 | Ostriker |
| 5,714,917 A | 2/1998 | Ella |
| 5,872,493 A | 2/1999 | Ella |
| 5,873,153 A | 2/1999 | Ruby et al. |
| 5,873,154 A | 2/1999 | Ylilammi et al. |
| 6,198,208 B1 | 3/2001 | Yano et al. |

(Continued)

FOREIGN PATENT DOCUMENTS

EP  1106708 A2  6/2001

(Continued)

OTHER PUBLICATIONS

Y. Yoshino et al., "Effect of Buffer Electrodes in Crystallization of Zinc Oxide Thin Film for Thin Film Bulk Acoustic Wave Resonator," Mai. Res. Soc. Symp. Proc. vol. 605, no date provided.

*Primary Examiner*—Thomas M. Dougherty
(74) *Attorney, Agent, or Firm*—Volentine & Whitt, PLLC

(57) ABSTRACT

An acoustic resonator of one inventive aspect includes a substrate, at least one generally crystalline primer layer provided on the substrate either directly or on top of one or more intermediate layers, a generally smooth and generally crystalline electrode layer provided on the primer layer, and a piezoelectric layer provided on the electrode layer. The primer layer, or at least one of the primer layers, has a crystallographic structure belonging to a first crystal system, and the electrode layer has a crystallographic structure belonging to a second crystal system which is different to the first system. The atomic spacing of the primer layer or at least one of said primer layers and that of the electrode matches to within about 15%.

2 Claims, 3 Drawing Sheets

U.S. PATENT DOCUMENTS

| | | |
|---|---|---|
| 6,294,860 B1 | 9/2001 | Shimada et al. |
| 6,335,069 B1 | 1/2002 | Ogawa et al. |
| 6,335,207 B1 | 1/2002 | Joo et al. |
| 6,420,260 B1 | 7/2002 | Ngan et al. |
| 6,842,088 B2 | 1/2005 | Yamada et al. |
| 7,141,913 B2 * | 11/2006 | Shearer et al. ............ 310/322 |
| 2004/0021400 A1 | 2/2004 | Bradley et al. |

FOREIGN PATENT DOCUMENTS

| | | |
|---|---|---|
| EP | 1124269 A2 | 8/2001 |
| WO | WO 2004/015862 A2 * | 2/2004 |

* cited by examiner

SEM micrograph of the Mo film deposited in a standard chamber using Ar as the sputtering gas SEM micrograph of the Mo film deposited in a standard chamber using Kr as the sputtering gas

ACOUSTIC RESONATORS

CROSS-REFERENCE TO RELATED APPLICATIONS

This is a divisional of U.S. non-provisional application Ser. No. 10/637,654, filed Aug. 11, 2003, and now U.S. Pat. No. 6,944,922, which makes a claim of priority to U.S. provisional application No. 60/402,728, filed Aug. 13, 2002, and to British patent application nos. 0218762.3 and 0227981.8, filed Aug. 13, 2002 and Nov. 30, 2002, respectively. The entire contents of these four priority applications are incorporated herein by reference.

BACKGROUND OF THE INVENTION

1. Field of the Invention

This invention relates to acoustic resonators and methods for forming such devices. In particular, but not exclusively, this invention relates to an electrode of Molybdenum (Mo) upon which is deposited a piezoelectric layer for example of Aluminium Nitride (AlN). Such structures are typical of acoustic resonators formed on silicon wafers.

2. Description of the Related Art

Acoustic resonators are used as RF filters and resonators such as Bulk Acoustic Wave (BAW) or Film Bulk Acoustic Resonators (FBAR), and the term "acoustic resonator" is used broadly to cover all such devices and others using similar structures. In such devices, a piezoelectric layer of e.g. crystalline Aluminium Nitride lies between at least two electrodes. Upon application of a high frequency voltage to the structure the piezoelectric layer will vibrate in an allowed vibrational mode at a chosen frequency thereby enabling a band pass filter or frequency stabilization.

Molybdenum is used in e.g. FBAR devices as the bottom electrode as it has the advantage of lower acoustic losses, due to its higher stiffness, compared to other electrode metals like Al, Pt, Au and Ti. A benefit related to the lower acoustic losses in Mo is the higher Q factor of devices, with Q determining the speed with which the filter switches on and off.

One of the primary requirements for the good performance of FBAR devices is a sharp {0002} texture in the AlN films, with a full width, half maximum (FWHM) of the rocking curve on a preselected crystallographic plane preferably of 2.0° or less. It is known that the texture of the AlN films is strongly dependent on both the roughness and the texture of the underlying electrode upon which it is deposited. A smooth underlayer with a sharp texture is the best possible combination.

In GB-A-2 349 392 the applicants describe the use of atomic hydrogen in a plasma either prior to, during or after the deposition of the underlying electrode. This then resulted in an improved quality of an Aluminium Nitride layer subsequently deposited upon that electrode. The process was not well understood at the time and therefore not optimised.

In U.S. Pat. No. 6,060,818 it was shown that polishing the surface of a phosphorus doped silica glass (PSG) layer to a mirror finish enabled a well-collimated film of Molybdenum to be deposited. This disclosure further states that this mirror finish to the PSG layer then formed the basis for a highly textured c-axis piezoelectric layer "in spite of the fact that it does not contain a crystalline structure that "seeds" the piezoelectric layer". The PSG layer of this disclosure is a sacrificial layer, being subsequently wet etched to create a cavity. The chemical mechanical polishing process and subsequent cleaning are both complex and expensive.

There therefore remains a need for an improved method of depositing a lower electrode suitable as a surface upon which to deposit a piezoelectric layer, but which does not require a sacrificial layer under the electrode layer and/or polishing of the immediate underlay.

SUMMARY OF THE INVENTION

From their studies the applicants postulated that the under layer or layers beneath the electrode layer need to not only be smooth at their interface with the electrode layer but also to fulfil two functions, firstly to be atomic spacing matched to the electrode layer and secondly to buffer or at least partially to crystallographically isolate the lower electrode from the substrate beneath.

The applicants have discovered methods of achieving this.

Accordingly, in one aspect of this invention, there is provided an acoustic resonator comprising:
- a substrate;
- at least one generally crystalline primer layer provided on said substrate either directly or on top of one or more intermediate layers;
- a generally smooth and generally crystalline electrode layer provided on said primer layer; and
- a piezoelectric layer provided on said electrode layer, wherein:
  (i) the primer layer, or at least one of the primer layers, has a crystallographic structure belonging to a first crystal system,
  (ii) said electrode layer has a crystallographic structure belonging to a second crystal system which is different to said first system; and
  (iii) the atomic spacing in at least one orientation of said primer layer or at least one of said primer layers and that of said electrode matches to within about 15%.

From another aspect the invention consists in an acoustic resonator comprising:
- a substrate;
- at least one generally crystalline primer layer provided on said substrate either directly or on top of one or more intermediate layers;
- a generally smooth and generally crystalline electrode layer provided on said primer layer; and
- a piezoelectric layer provided on said electrode layer, wherein:
  (vi) the primer layer, or at least one of the primer layers, has a crystallographic structure belonging to a first crystal system, and
  (vii) said electrode layer has a crystallographic structure belonging to a second crystal system which is different to said first system; and
  (viii) the atomic spacing, in at least one orientation, of said primer layer, or at least the primer layer which interface with the electrode, and that of said electrode matches to within about 15%.

For the sake of clarity the conductive layer upon which the piezoelectric layer is deposited is referred to as the 'electrode' irrespective of whether it performs the function of electrical current carrier on its own or in cooperation with conductive underlayers. Whilst Aluminium Nitride is well known as a piezoelectric layer and is given here as an example, other piezoelectric materials that are used include zinc oxide (ZnO) and lead zirconate titanate (PZT).

The substrate beneath may comprise for example acoustic mirror layers or an amorphous layer (which may possibly be a sacrificial layer which is partly or completely removed during a subsequent processing step) or some other layer creating a smooth surface. It is quite likely that the surface on which the electrode structure is deposited will have poor or no crystallography and so the primer layer is selected to be of crystalline structure but of a different crystal system to that of the electrode such that a poor crystallographic or disordered structure in the underlying substrate is not replicated in the electrode layer. Thus the primer layer is selected to have the properties that it has a different crystallographic structure to the electrode layer to reduce any tendency for the amorphous or disordered nature of the substrate to be replicated in the electrode layer, and good (i.e. within about 15%) atomic spacing matching between the primer layer and the electrode layer.

In one example, a single primer layer is provided between the substrate and the lower electrode layer, with the single primer layer providing both of the functions referred to. Alternatively, there may be two or more primer layers, with a lower primer layer selected to have a crystallographic structure different from that of the electrode layer, and an upper primer layer selected to be atomic spacing matched to the electrode layer.

In one example, a single primer layer has a crystallographic structure belonging to a hexagonal crystal system and said electrode layer has a crystallographic structure belonging to a cubic crystal system. For example the electrode layer may be of Molybdenum (cubic crystal system) and the primer layer may be selected from e.g. Aluminium Nitride or hexagonal alpha form Titanium. The primer layer may be an element, alloy or compound of stoichiometric or non-stoichiometric material.

The Molybdenum electrode layer may be in substantially elemental form or alloyed or otherwise combined with other elements.

In an alternative electrode system, the electrode layer may be of any suitable metallic material of cubic crystalline form e.g. Tungsten, Silicon, Aluminium, Copper, Gold, Nickel, Platinum, Tantalum or an alloy or compound, such as TiW and the primer layer may be of a layer or layers of another crystalline form e.g. tetragonal, rhombic or hexagonal and may be an element, compound or alloy. Such layers may include for example Titanium (which is unusual in being dimorphic and being hexagonal in the alpha form), Indium, Aluminium nitride, Tantalum nitride, Tungsten Silicide, Zinc and Molybdenum Carbide.

Preferably the primer layer has a thickness of no greater than about 200 nm, more preferably no greater than about 100 nm, and advantageously about 50 nm as the applicants have found that thicker primer layers tend to degrade the texture of the electrode layer.

Depending on the particular circumstances, there may be a single primer layer provided on the substrate on which is provided a single electrode layer on which is provided the piezoelectric material, or there may be a multi-layer structure provided on the substrate.

In another aspect this invention provides a method of forming an acoustic resonator which comprises the steps of:
depositing a primer layer;
depositing an electrode layer containing Molybdenum on the upper surface of said primer layer; and
depositing a layer of piezoelectric material on an uppermost electrode layer,
wherein said primer layer comprises a generally crystalline material having a atomic spacing which matches in at least one orientation the atomic spacing of said electrode layer to within about 15% and is not of cubic crystalline form.

In some embodiments the deposition of the primer layer is carried out at substrate temperature of less than about 100° C.; 20° C. to 100° C. may be a suitable range. It may also be preferred not to have a vacuum break between the deposition of the primer layer and the electrode layer.

In some situations it may not always be possible to use primer layers or to deviate from a Molybdenum electrode. For example, the acoustic resonator may have an acoustic mirror below the lower electrode making it difficult to implement the above techniques. Further experiments were therefore carried out to improve the crystallographic texture of the piezoelectric material formed on a lower electrode without a primer layer. It should be noted however that the techniques developed as a result of these studies may also be used in conjunction with the primer layer structures described above.

Accordingly, in a yet further aspect of this invention, there is provided an acoustic resonator comprising:
a substrate,
an electrode layer comprising Molybdenum provided directly on said substrate or indirectly on one or more intermediate layers on said substrate; and
a layer of piezoelectric material provided on said electrode layer,
wherein said Molybdenum electrode layer is deposited by a predominately Neon sputtering process and the electrode layer being treated with a hydrogen plasma.

The applicants postulated that sputtering Molybdenum onto a substrate using a gas poorly mass-matched to the target material would lead to a smoother electrode surface having an improved FWHM. Studies conducted with Argon and Krypton suggested that this hypothesis is true, as a Molybdenum electrode deposited on a substrate using Argon as the sputtering gas had a smoother appearance than that using Krypton. However further work by the applicants showed that, although the FWHM of the Molybdenum surface decreased when Argon was used, when Neon (atomic weight 20) was used the FWHM deteriorated. However, quite unexpectedly, it was found that the FWHM of a piezoelectric material (Aluminium Nitride) deposited on Molybdenum using Neon sputtering was considerably improved if the electrode layer was treated with a hydrogen plasma, and indeed gave excellent FWHM results which in tests were better than those achieved using Argon sputtering.

In another aspect this invention provides a method of forming an acoustic resonator which comprises the steps of:
using a Neon sputtering process and a Molybdenum target to provide an electrode layer comprising Molybdenum directly on a substrate, or indirectly on one or more intermediate layers on a substrate;
treating said electrode layer with a hydrogen plasma; and
providing a layer of piezoelectric material on said electrode layer.

The piezoelectric material may conveniently comprise Aluminium Nitride.

The hydrogen plasma treating may be carried out using a parallel plate type reactor, and a hydrogen pressure in the range from about 1 to about 10 Torr, using a frequency in the range of from about 180 KHz to about 27.12 MHz and at a power in a range of from about 0.5 to about 10 KW for a 200 mm substrate diameter.

From a still further aspect the invention consists in a method of selecting a primer layer for a lower electrode layer in an acoustic resonator comprising selecting a layer of different crystallography to the electrode layer and with an atomic spacing, in at least one orientation, that matches the atomic spacing of the electrode layer to within about 15%.

The primer layer may comprise more than one layer and the different crystallographic structure may be in a lower layer.

Whilst the invention has been described above it extends to any inventive combination set out in the description or the claims appended hereafter.

BRIEF DESCRIPTION OF THE DRAWINGS

The invention may be performed in various ways, and specific embodiments will now be described, by way of example, with reference to the accompanying drawings, in which.

DETAILED DESCRIPTION OF THE PREFERRED EMBODIMENTS

Figure 1:
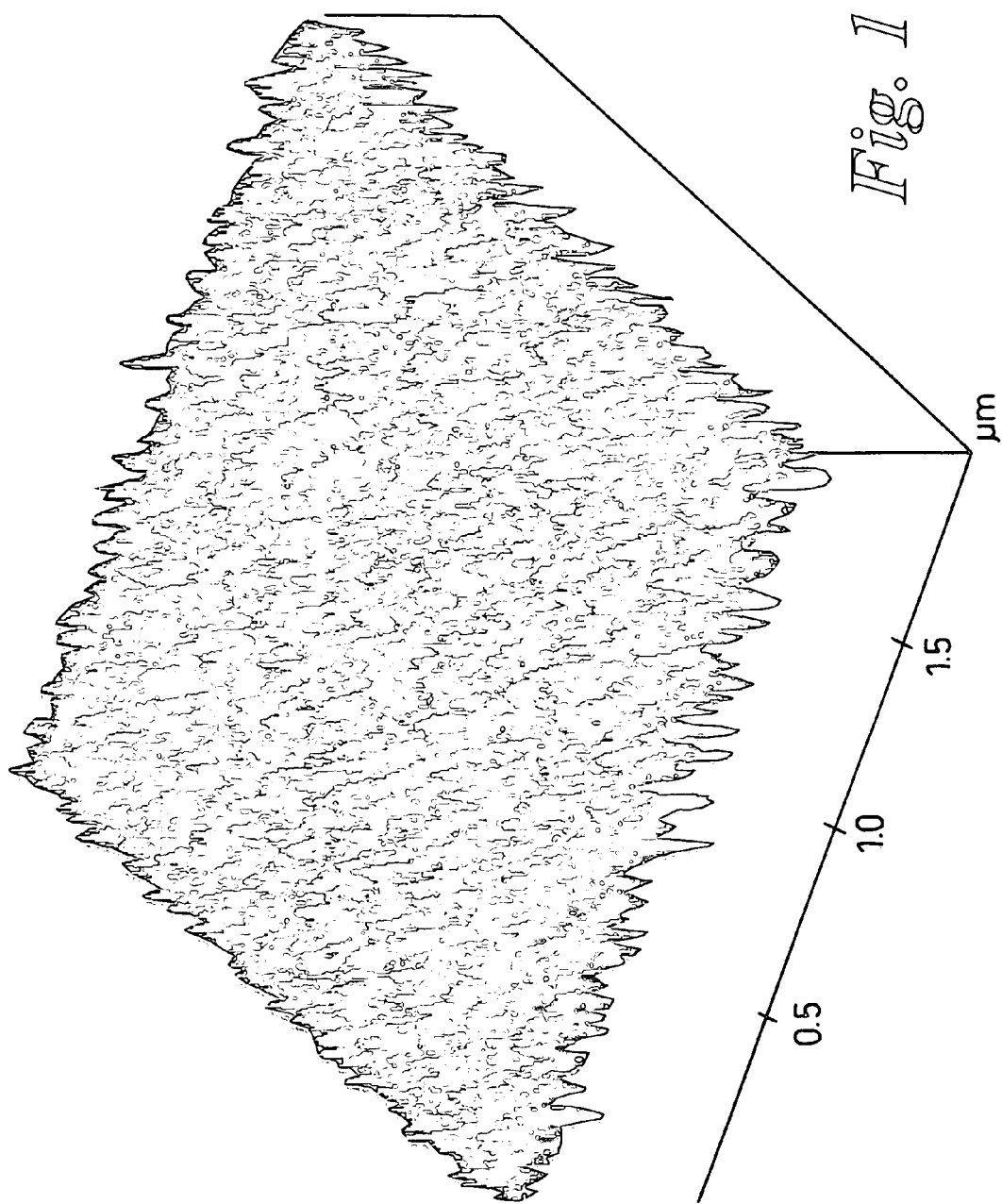
FIG. 1 is an Atomic Force Microscope (AFM) micrograph of an electrode structure comprising an electrode layer of Molybdenum deposited on a primer layer of Aluminium Nitride deposited on a substrate.

Experiments were performed by firstly depositing a primer layer under a Mo film to see if certain primer layers could promote the growth of a well-textured Mo film. The results are summarised in Table 1.

In Table 1 the heading 'atomic mismatch' is used to indicate the percentage difference in atomic spacing of the primer layer on the plane corresponding to the surface, with respect to the Molybdenum layer deposited upon it. For example hexagonal crystals may have very different atomic spacings presented at the same time, depending on the orientation of the crystal. This is discussed further with particular respect to Titanium.

Primer layers were chosen on the basis of their atomic spacing match with Mo (the atomic spacing of Molybdenum, $a_{Mo}$=2.725 Å) where the primer was crystalline, and non-cubic in crystalline form. This suggested Tantalum nitride, with an $a_{Ta2N}$=3.05 Å, Aluminium nitride and Titanium, particularly in its hexagonal alpha form as good primer layers for Mo.

Titanium is dimorphic, existing in both hexagonal and cubic form and depending on deposition conditions the hexagonal form Titanium may present its crystal orientation in one of two main ways. Depositing titanium at low temperatures (typically less than 100° C.) e.g. at a substrate temperature of 40° C. created the {0002} orientation, whilst depositing at higher temperatures e.g. a substrate temperature of 400° C. created the {1$\bar{1}$01} orientation with widely differing atomic distances in the crystal plane. This was found to produce inferior Molybdenum electrode layers.

As a further comparison a poor crystalline matching material Molybdenum Nitride was also experimented as was an amorphous SiON layer which is very smooth, but non-crystalline.

TABLE 1

Summary of results with various primer layers under Mo.

| Primer Layer and its crystalography | (atomic mismatch with Mo) | Primer layer thickness | 180 nm Mo FWHM | AlN FWHM on the stack |
|---|---|---|---|---|
| AlN hexagonal | 14.1% | 15 nm | 1.84 | 1.10 |
| AlN hexagonal | 14.1% | 25 nm | 1.76 | 1.18 |
| AlN hexagonal | 14.1% | 50 nm | 1.88 | 1.22 |
| AlN hexagonal | 14.1% | 100 nm | 1.92 | 1.14 |
| Ti {0002} hexagonal | 8.25% | 15 nm | 2.78 | 1.36 |
| Ti {002} hexagonal | 8.25% | 25 nm | 2.86 | 1.42 |
| Ti {0002} hexagonal | 8.25% | 50 nm | 3.26 | 1.58 |
| Ti {0002} hexagonal | 8.25% | 100 nm | 3.98 | 1.84 |
| Ti {1$\bar{1}$01} hexagonal but a degree of crystal mismatching | 103% and 8.25% | 25 nm | 3.26 | 2.00 |
| Ti {1$\bar{1}$01} hexagonal but a degree of crystal mismatching | 103% and 8.25% | 50 nm | 3.42 | 2.24 |
| Ti {1$\bar{1}$01} hexagonal but a degree of crystal mismatching | 103% and 8.25% | 100 nm | 3.7 | 2.46 |
| Ta cubic (Well matched, but same crystal form) | 6.45% | 50 nm | Broad | Broad |
| MoN | 82% | 25 nm | 11.64 | 5.36 |
| Mo$_2$N | 33% | 25 nm | 13.74 | 6.88 |
| Non crystaline SiON | amorphous | 5 nm | 19.50 | Broad |

The results from these experiments identify a way of selecting a primer layer to produce a well-textured lower electrode layer in an acoustic resonator by selecting a primer layer that is crystalline, of a different crystallography to the electrode layer and with a close atomic distance matching, e.g. within about 15% to that electrode layer.

It can be seen that AlN deposited on well-oriented Mo (FWHM=1.84°) is also well oriented (FWHM=1.10°). There appears to be a direct correlation between a well oriented Mo electrode layer and well oriented AlN piezoelectric layer deposited upon it. It is also noted that a thicker primer layer tends to degrade the Mo texture. This, it is believed, is due to the thicker primer layers being rougher.

Quite expectedly Mo Nitride primer layers with poor atomic spacing match with Mo gave poor Mo texture. A very smooth amorphous SiON primer also gave poor Mo texture.

It is hypothesised that good piezoelectric electrode layers might also be formed on stack structures consisting of e.g. hexagonal Titanium, cubic Aluminium with an upper cubic Molybdenum layer. This stack structure would provide the required change in crystallography (hexagonal to cubic in this example) between the lower Titanium and the overlying Aluminium. In such a structure the primer layers would typically total no more than 500 Å in thickness with each layer of typically 150 Å with the upper electrode layer of greater than 1,000 Å, and typically of 2,000 Å thickness. This example is given to demonstrate the generality of the invention, the upper Aluminium and Molybdenum layers could together be considered the electrode as they are both conductive and indeed no single conductive layer need exceed 1,000 Å thickness if several layers add to a suitable thickness as to perform this function.

Atomic Force Microscope (AFM) and FWHM studies were carried out on the AlN(50 nm)/Mo (180 nm) stack and a micrograph of such a structure is shown in FIG. 1. The rms roughness is 0.50 nm. The Mo FWHM is 2.4° and the AlN FWHM is 1.22°. The z-axis is 5 nm.

It may not always possible to use primer layers or deviate from a Mo electrode, perhaps due to the design of an acoustic mirror below the lower electrode. Further experiments were therefore performed to improve the AlN texture upon a Molybdenum lower electrode without a primer layer.

Figure 2:
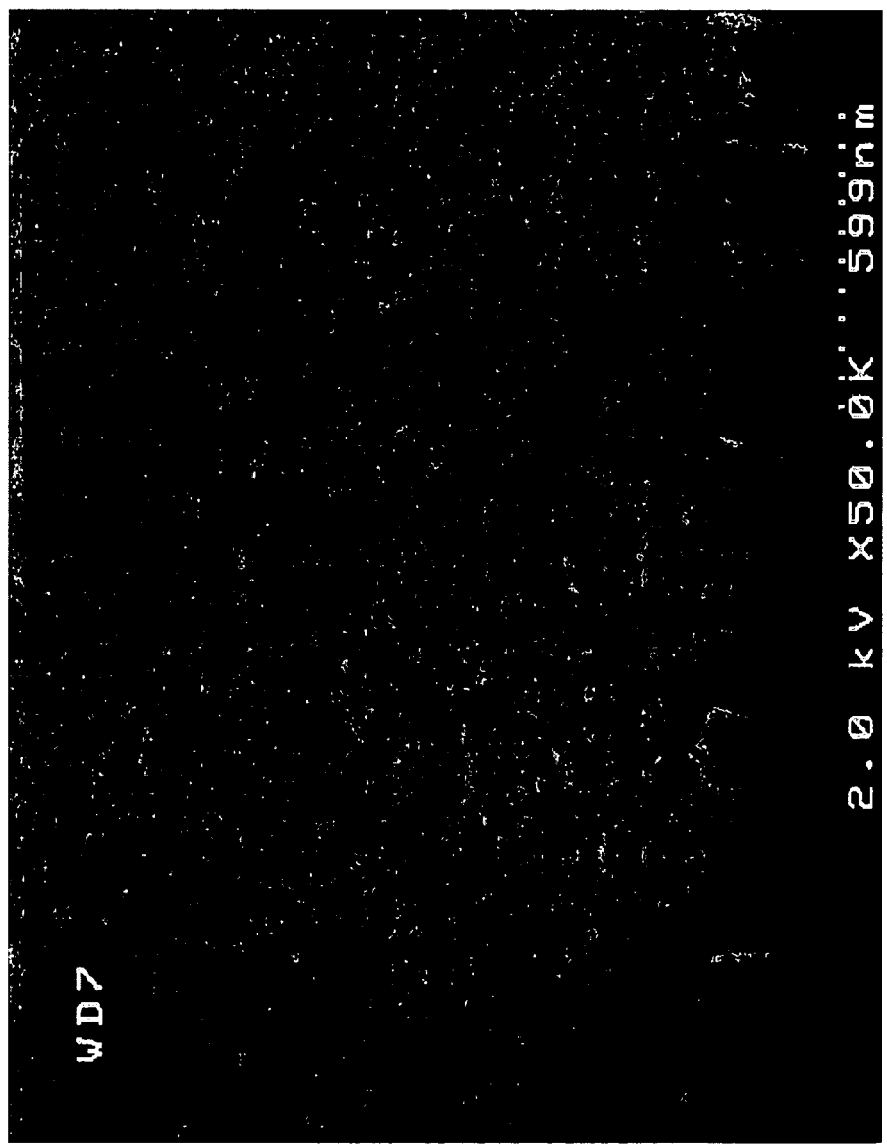
FIG. 2 is a Scanning Electron Micrograph (SEM) of a Molybdenum film deposited in a standard chamber using Argon as the sputtering gas.
Figure 3:
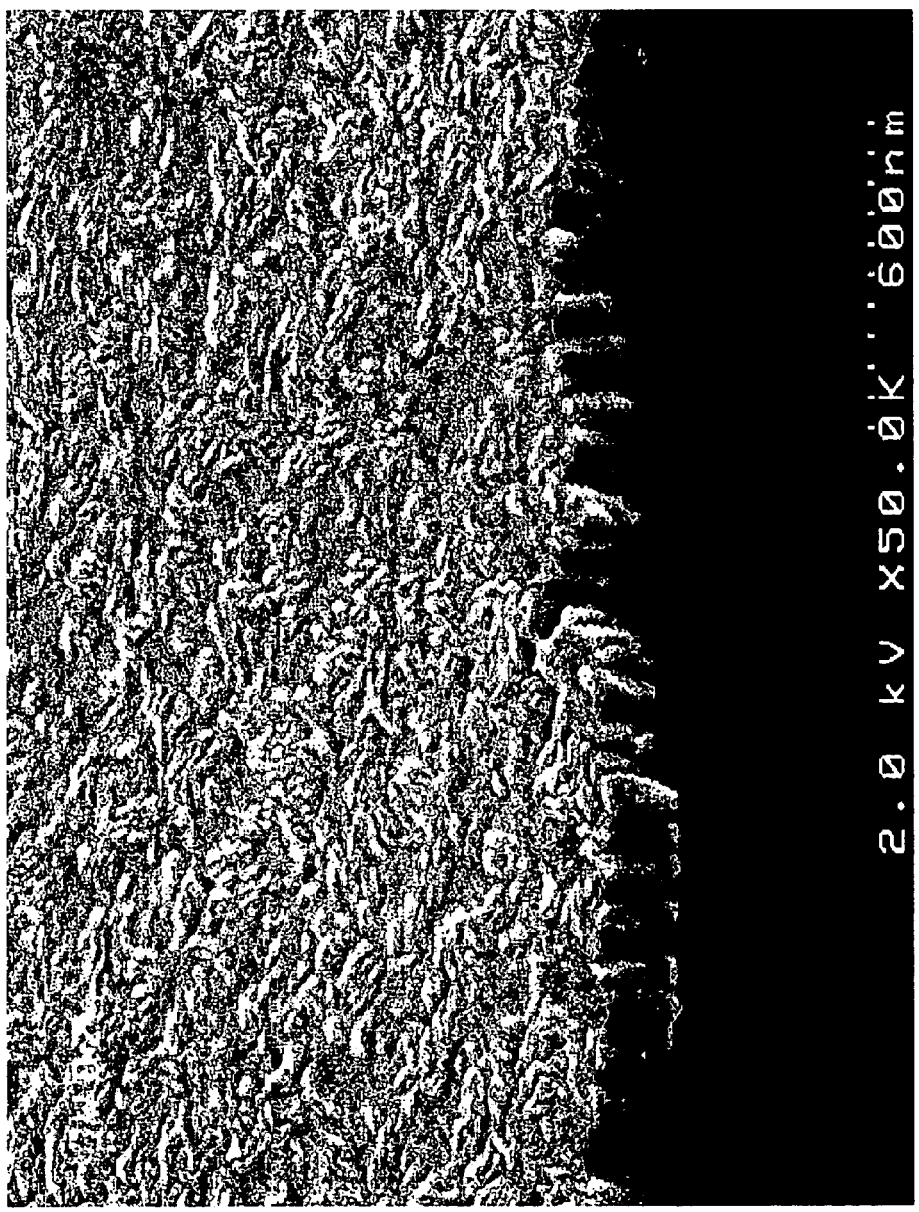
FIG. 3 is an SEM micrograph of a Molybdenum film deposited in a standard chamber using Krypton as the sputtering gas.

The sputtering process utilizes ions of noble gas to impact upon a target. Sputtering efficiency is improved by using a sputtering gas that matches the mass of the target atoms. So, for example differences seen between Ar and Kr efficiency are probably due to the efficiency of energy transfer between the Mo atoms and the sputtering gas atoms. The energy transfer is higher between Kr and Mo ($E_t$=0.99) than that between Ar and Mo ($E_t$=0.83) due to the better mass match between Kr (atomic weight 80) and Mo (atomic weight 96). So the Mo atoms sputtered using Kr will have a lower energy than those sputtered using Ar. This explains the noticeable difference in the roughness of Mo films deposited in Argon and Krypton (FIGS. 2 and 3) and the difference in the subsequent AlN texture on these films.

This suggests that smoother Aluminium Nitride layers may be achieved by sputtering the lower Molybdenum electrode using a sputtering gas poorly mass matched to the target material. This therefore provides higher residual energy levels to the sputtered target material as it arrives at the wafer surface (though at the loss of sputtering efficiency).

Experiments were therefore performed with the Molybdenum electrode layer deposited in Argon, Krypton and Neon upon an insulator and then Aluminium Nitride sputtered upon this Molybdenum layer. Further, for some experiments a hydrogen plasma treatment was performed on the Mo lower electrode layer prior to sputtering the Aluminium Nitride layer. The hydrogen treatment chamber was a closely spaced parallel plate type reactor with RF at 13.56 MHz applied to an upper showerhead. Best results were obtained at 2 kW power and hydrogen pressure of 4 Torr. These experiments are summarised in Table 2.

Surprisingly the best AlN FWHM result is achieved by a hydrogen plasma treatment of the worst FWHM underlay Mo. This is completely unexpected and the hydrogen treatment of the Mo deposited with Neon transforms the worst Mo underlay into the best, by some considerable margin.

The process window for hydrogen plasma treatment was found to be quite broad with a general trend of improving AlN FWHM results (smaller angles) for higher powers and pressures. Within the range 0.5 to 2 kW applied for a 200 mm wafer and 0.5 to 4 torr good results were obtained with the best results at 2 kW and 4 Torr.

By contrast a low frequency RF of 356 KHz was tried in place of 13.56 MHz with no change in the AlN FWHM angle for process times up to 150 seconds and blistering of the Mo films at longer process times. The electrodes were closely spaced (less than 30 mm) in the plasma reactor used. Lower pressures and frequencies are associated with increased energy of bombardment so the experimental evidence is that increased flux but at low energy levels leads to the best results.

TABLE 2

Summary of results of Mo films in a standard sputtering chamber using different sputtering gases

| Sputter gas | Deposition Rate @6 kW (nm/min) | $R_s$ (1 σ %) 200 mm | Stress (dyne/cm$^2$) | Mo μΩ-cm | Mo FWHM | AlN FWHM on Mo before H$_2$ treatment | AlN FWHM on Mo after H$_2$ treatment |
|---|---|---|---|---|---|---|---|
| Neon | 270 | 1.29 | −1.0E10 | 18.15 | 11.0 | 6.4 | 1.22 |
| Argon | 540 | 1.45 | +2E9 | 9.16 | 7.7 | 5.6 | 2.3 |
| Krypton | 550 | 1.50 | +1.0E10 | 8.4 | 9.0 | 6.26 | 2.58 |

In all cases it is preferred that the electrode layer is deposited upon the surface of the primer layer(s) without exposure of that surface to atmosphere and this is best achieved in a multi-chamber 'cluster' type single wafer sputtering system such as the Sigma® sputter system that is commercially available from the applicants or a similar system such as the Endura® available from Applied Materials Inc.

It has been shown that the quality of a piezoelectric layer deposited upon the electrode layer can be dramatically improved by selecting an appropriate primer layer. This is an update with further experimental results.

All molybdenum depositions described above were carried out in a standard close coupled (45 mm throw) magnetron sputtering chamber. It has however been found that when an Ultra™ sputter chamber (commercially available from Trikon Technologies Inc. and as described in WO 02/11176 with a 430 mm source to substrate distance and magnetic coils, is used for the molybdenum deposition on a suitable primer layer then the molybdenum electrode and subsequently deposited aluminium nitride piezoelectric layer FWHM angles are improved. This is a surprising result as it is not the case where no primer layer is used and the reasons for this improvement are not presently understood but may be explained as follows.

The magnetic coil confinement has the effect of increasing plasma density at the target and thereby increases the degree of sputtered material ionisation from about 5% to about 20%-25% with 1350 ampere turns to the coil. The elongated source to substrate distance (at least 5 times greater than standard) has the effect of separating the substrate from the target plasma thereby reducing substrate bombardment. Even without applied substrate bias a wafer will typically take on a negative self bias of 10's of electron volts thereby attracting a degree of bombardment from ionised gas and/or sputtered material. The long-throw chamber is necessarily less materials efficient (one tenth of the deposition rate upon the substrate), there is no step coverage requirement (as resonators are flat), and no FWHM angle improvement is seen without a primer layer under the electrode. For these reasons a long throw chamber is contra-indicted by all the known requirements of this application and is an unusual choice for experimentation. Table 3 summarises the results.

TABLE 3

Comparative results for Standard and Ultra™ chambers

| | Ultra | | Standard | |
|---|---|---|---|---|
| Ti thickness | Mo FWHM angle | AlN FWHM angle | Mo FWHM angle | AlN FWHM angle |
| 15 nm | 1.8° | 1.14° | 2.84° | 1.4° |

The titanium was deposited 'cold' (a nominal 40° C.) and the standard (45 mm source to substrate distance) values are directly comparable to those in Table 1 and differ only within the range of experimental results.

To determine in more detail the conditions under which the preferred {0002} and {1$\bar{1}$01} textures of titanium are deposited the following experiments were performed as shown in table 2. XRD measurements on the Ti films deposited at 400° C. showed that the texture was {1$\bar{1}$01} with a very faint {0002} peak. A {0002} texture in Ti is required to promote the growth of well-oriented Mo films. It was found that depositing the Ti films colder would promote the growth of {0002} texture. As the wafers are heated to outgas in a heat station prior to sputtering, low deposition temperatures require a cooling step. This was achieved experimentally by backfilling the titanium chamber with argon to increase thermal conductivity to the wafer chuck. More elegantly it may be achieved by suitable clamp/cooling methods such as electrostatic wafer clamping and wafer backside gas pressurisation. Ti films were then deposited at 100° C. and 40° C. in order to promote {0002} texture and the results are shown in Table 4.

TABLE 4

Results for a Ti(15 nm)/Mo(400 nm) stack with Mo deposited at 200° C. in an Ultra chamber with magnetic coils powered.

| Ti deposition conditions | Ti texture | Mo FWHM angle | AlN FWHM angle |
|---|---|---|---|
| 400° C., No Backfill cool | {1$\bar{1}$01} | 2.34° | 1.4° |
| 100° C., Backfill cool | {0002} | 2.1° | 1.28° |
| 40° C., Backfill cool | {0002} | 1.76° | 1.14° |

AlN FWHM angle on Si carrier wafer = 1.2°

The following conclusions can be drawn from the results presented in table 4. Ti {0002} texture is more effective than the {1$\bar{1}$01} texture in promoting good Mo texture, the wafer needs to be cold during Ti deposition in order to obtain {0002} texture in Ti and the AlN texture improves with an improvement in the Mo texture.

As has already been shown, the reasons for the effectiveness of the Ti seed and in particular the {0002} seed are the matching of the atomic spacings of the seed to that of the electrode.

The lattice parameters and the atomic spacings for the relevant planes for Ti, Mo and AlN are shown in the table below.

TABLE 5

Atomic mismatch between the seed layers and Mo.

| Element/ Compound | Structure | Lattice parameter (Å) | Atomic spacing (Å) | Mismatch with respect to Mo | Mismatch with respect to W |
|---|---|---|---|---|---|
| Mo | {110} cubic | 3.1472 | 2.725 | 0.0% | 0.5% |
| Ti | {0002} hexagonal | a = 2.95 c = 4.686 | 2.95 | 8.25% | 7.6% |
| Ti | {1$\bar{1}$01} Hexagonal, but a degree of crystal mismatching | | 2.95 and 5.53 | 8.25% 103% | 7.6% 102% |
| AlN | {0002} Hexagonal | a = 3.11 | 3.11 | 14.1% | 13.5% |
| W | Cubic | a = 3.1648 | 2.74 | 0.5% | 0.0% |

It can be seen from Table 5 that the lattice match for Mo on the {110} planes (which is the preferred texture in Mo) is better with {0002} textured Ti seeds. This explains the better Mo FWHM seen on the Ti films deposited colder than 100° C.

Tungsten has the best atomic match with Mo and it therefore a candidate for use as a seeding layer for well-textured Mo films. It is however useless in this regard as (like Mo) the texture of as-deposited W films (without 'seeding' or primer layers) is poor (FWHM>10.0°). This poor texture would be replicated in the over-lying Mo films. By contrast Ti can be deposited with an FWHM of less than 4.5° though the texture of Ti is not the only factor influencing the Mo texture. It is found that Mo (and AlN) texture degrades with increasing thickness of the Ti primer layer, whereas Ti texture improves with increasing thickness. The {0002} Ti FWHM is 4.5° for a 15 nm Ti film and 3.52° for a 100 nm Ti film. The degrading of the Mo texture with increases in thickness of the Ti primer is possibly due to the roughening of the Ti film with increasing thickness.

The ideal primer therefore has close atomic spacing matching with the electrode layer and is well textured and smooth as-deposited. The optimal thickness of a titanium primer layer is shown in table 6. In general the best electrodes for resonators will be cubic and the best primer layers will be hexagonal in crystalline form.

TABLE 6

Table showing the results of Mo depositions on Ti primer layers of different thickness.

| Ti thickness | Mo FWHM angle | AlN FWHM angle |
|---|---|---|
| 0 nm | 12.1° | >6.0° |
| 10 nm | 2.94° | 1.9° |
| 15 nm | 2.34° | 1.4° |
| 20 nm | 2.48° | 1.64° |
| 25 nm | 3.26° | 2.00° |
| 50 nm | 3.42° | 2.24° |
| 100 nm | 3.7° | 2.46° |

AlN FWHM angle on Si carrier wafer = 1.18°

The Ti films were deposited at 400° C. with a {1$\bar{1}$01} texture with a very faint {0002} peak. A {0002} texture in Ti is required to promote the growth of well-oriented Mo films. The Mo film was 500 nm thick and deposited at 200° C. in an Ultra™ chamber with coils powered. The AlN film was 1.5 μm thick and deposited at 400° C.

It was shown in Table 1 that AlN primer layers are more effective than the Ti for promoting the growth of well-oriented Mo films. This further suggests that atomic matching between the primer and electrode is not the only factor influencing the electrode texture. It is possible that the better texture and smoothness of the AlN seeds predominates over the better atomic matching between Ti and Mo.

More experiments were done (with a 45 mm source to substrate distance) to clarify the role of the primer layer texture in influencing the Mo texture. Poorly oriented AlN films can be deposited by taking out the degassing step prior to the AlN deposition.

TABLE 7

Summary of results with poorly oriented AlN primer layers under Mo. The comparative values for well-oriented AlN primer layers are shown in the brackets.

| AlN primer layer thickness | Mo FWHM | AlN piezo layer FWHM |
|---|---|---|
| 15 nm | 3.92 (1.84) | 1.8 (1.1) |
| 25 nm | 3.8 (1.88) | 1.86 (1.18) |
| 100 nm | 5.26 (1.92) | 3.32 (1.14) |

AlN FWHM on Si carrier wafer = 1.16°

It can be seen that well-oriented AlN films are a better primer layer than poorly-oriented AlN films. This may be due to improved smoothness as AFM studies have shown that well-textured Mo films are smoother than the poorly textured films.

Tungsten is another metal of interest as a bottom electrode applications in BAW devices. It can be seen from Table 5 that W has a good atomic matching with Ti and AlN, so Ti and AlN primer layers were also investigated for W films.

TABLE 8

Summary of Ti and AlN primer layers for W films

| Primer layer | W FWHM | AlN FWHM |
|---|---|---|
| None | Broad | 6.00 |
| Ti | 2.58 | 1.50 |
| AlN | 2.26 | 1.04 |

AlN FWHM on Si carrier = 1.12

It can be seen from the above table that both the Ti and AlN primer layers improve the W texture. As demonstrated for Mo, AlN is more effective than Ti in improving the W (and AlN) texture.

What is claimed is:

1. An acoustic resonator comprising:
   a substrate,
   an electrode layer comprising Molybdenum or Tungsten provided directly on said substrate or indirectly on one or more intermediate layers on said substrate; and
   a layer of piezoelectric material provided on said electrode layer,
   wherein said electrode layer is deposited by a predominately Neon sputtering process and said electrode layer is treated with a hydrogen plasma.

2. An acoustic resonator according to claim 1, wherein said electrode layer is formed on a primer layer of a generally crystalline form having an atomic spacing in at least one orientation which matches the atomic spacing of said electrode layer to within about 15% and is non cubic in crystalline form.

* * * * *